United States Patent
Chiu et al.

(10) Patent No.: US 8,050,553 B2
(45) Date of Patent: Nov. 1, 2011

(54) LENS MODULE AND ASSEMBLY METHOD THEREOF

(75) Inventors: Chi-Wei Chiu, Taipei Hsien (TW); Ssu-Han Huang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 12/763,130

(22) Filed: Apr. 19, 2010

(65) Prior Publication Data

US 2011/0150462 A1 Jun. 23, 2011

(51) Int. Cl.
*G03B 17/00* (2006.01)
(52) U.S. Cl. ........................................................ 396/542
(58) Field of Classification Search .................... 396/542
See application file for complete search history.

(56) References Cited

U.S. PATENT DOCUMENTS

| | | | | |
|---|---|---|---|---|
| 6,160,967 | A * | 12/2000 | Mizobuchi | 396/542 |
| 6,356,717 | B2 * | 3/2002 | Tanaka et al. | 396/542 |
| 6,727,564 | B2 * | 4/2004 | Shinomiya | 257/432 |
| 7,492,538 | B2 * | 2/2009 | Ishizawa et al. | 359/824 |
| 7,519,286 | B2 * | 4/2009 | Chung et al. | 396/133 |
| 7,633,543 | B2 * | 12/2009 | Shinomiya | 348/340 |
| 7,641,403 | B2 * | 1/2010 | Ishizawa et al. | 396/529 |
| 7,680,407 | B2 * | 3/2010 | Hsiao et al. | 396/133 |
| 2004/0042775 | A1 * | 3/2004 | Nomura | 396/73 |
| 2006/0153556 | A1 * | 7/2006 | Lee et al. | 396/133 |
| 2008/0267617 | A1 * | 10/2008 | Huang et al. | 396/535 |
| 2010/0091120 | A1 * | 4/2010 | Nagata et al. | 348/208.4 |
| 2010/0098394 | A1 * | 4/2010 | Ishihara et al. | 396/55 |
| 2010/0110571 | A1 * | 5/2010 | Ono et al. | 359/824 |

* cited by examiner

*Primary Examiner* — Rodney Fuller
(74) *Attorney, Agent, or Firm* — Altis Law Group, Inc.

(57) ABSTRACT

A lens module includes a flexible printed circuit board, a first sensor, a second sensor, an adjustment device, a lens, a protective frame, an outer housing, a drive mechanism and a resilient member. The flexible printed circuit board includes a first mounting portion and a second mounting portion. The first sensor and the second sensor are fixed on the flexible printed circuit board. The outer housing is connected to the flexible printed circuit board and covers on the outside of the adjustment device and the protective frame. The resilient member and the flexible printed circuit board are arranged on opposite sides of the outer housing. The flexible printed circuit board can be folded along a connecting line between the first mounting portion and the second mounting portion.

15 Claims, 7 Drawing Sheets

LENS MODULE AND ASSEMBLY METHOD THEREOF

BACKGROUND

1. Technical Field

The present disclosure generally relates to a lens module and an assembly method thereof.

2. Description of Related Art

A lens module is an important part of a camera. It is complicated to assemble the lens module due to the inclusion of many components and the requirement for higher precision, so as to ensure adequate optical performance.

A commonly used lens module includes a rigid printed circuit board, a lens assembly arranged thereon, and a driving device connected to the lens assembly. The driving device drives the lens assembly for a range of motion and allows the lens assembly to automatically focus for achieving superior optical effect. The lens module further includes a flexible printed circuit board and a sensor arranged on the flexible printed circuit board. The flexible printed circuit board is typically adhered to the rigid printed circuit board. A lens module is often very small, especially if used in a mobile phone, and components of such a lens module are also very small, thus, the flexible printed circuit board and the rigid printed circuit board require more precise positioning during assembly. If not, both may be scrapped, thereby increasing the manufacturing cost of the lens module.

Therefore, there is room for improvement within the art.

BRIEF DESCRIPTION OF THE DRAWINGS

The components in the drawings are not necessarily drawn to scale, the emphasis instead being placed upon clearly illustrating the principles of the present disclosure. Moreover, in the drawings, like reference numerals designate corresponding parts throughout several views, and all the views are schematic.

DETAILED DESCRIPTION

Figure 1:
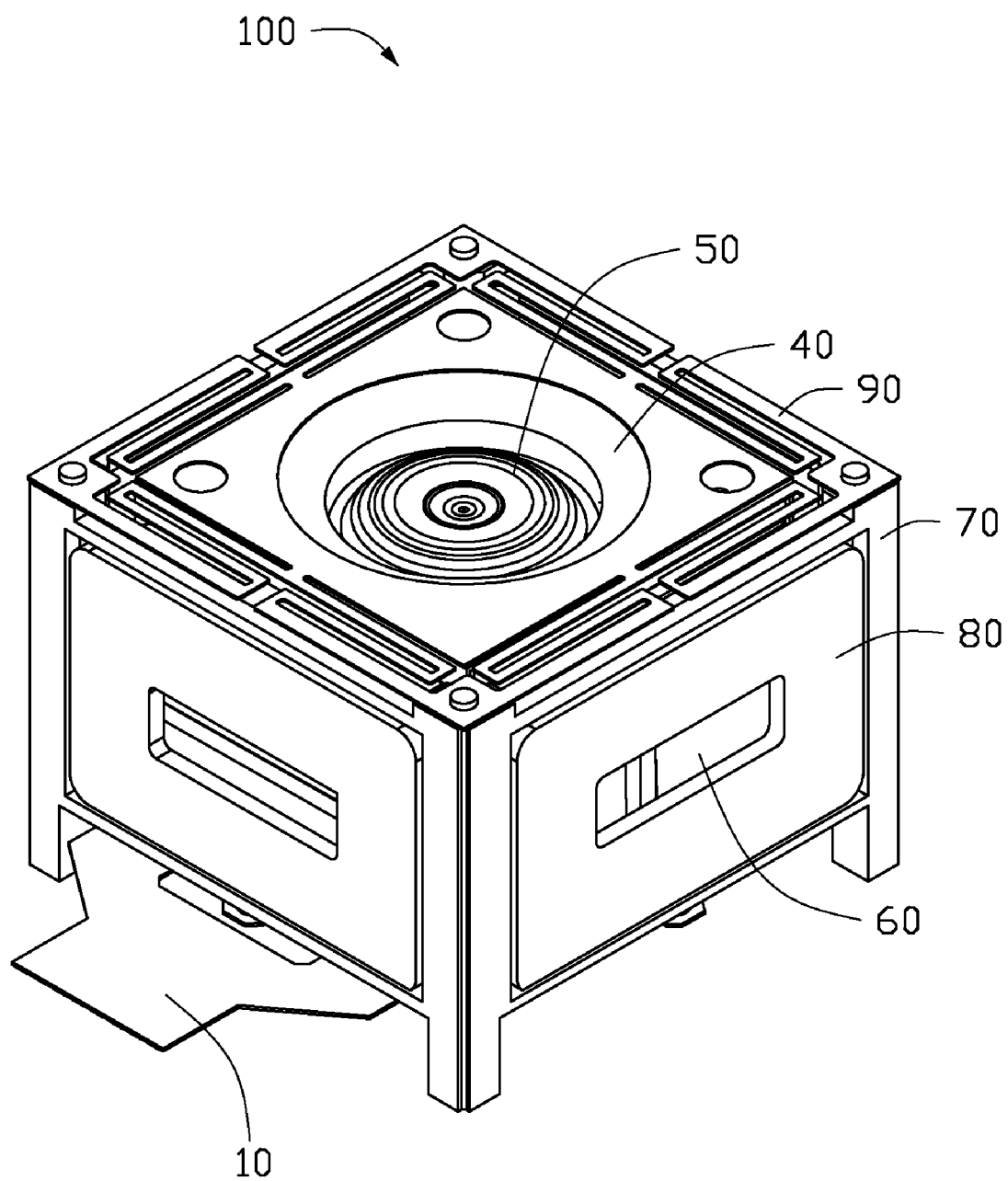
FIG. 1 is an assembled, isometric view of a lens module, the lens module including a lens, an adjustment device, a first sensor, a second sensor, and a flexible printed circuit board.
Figure 2:
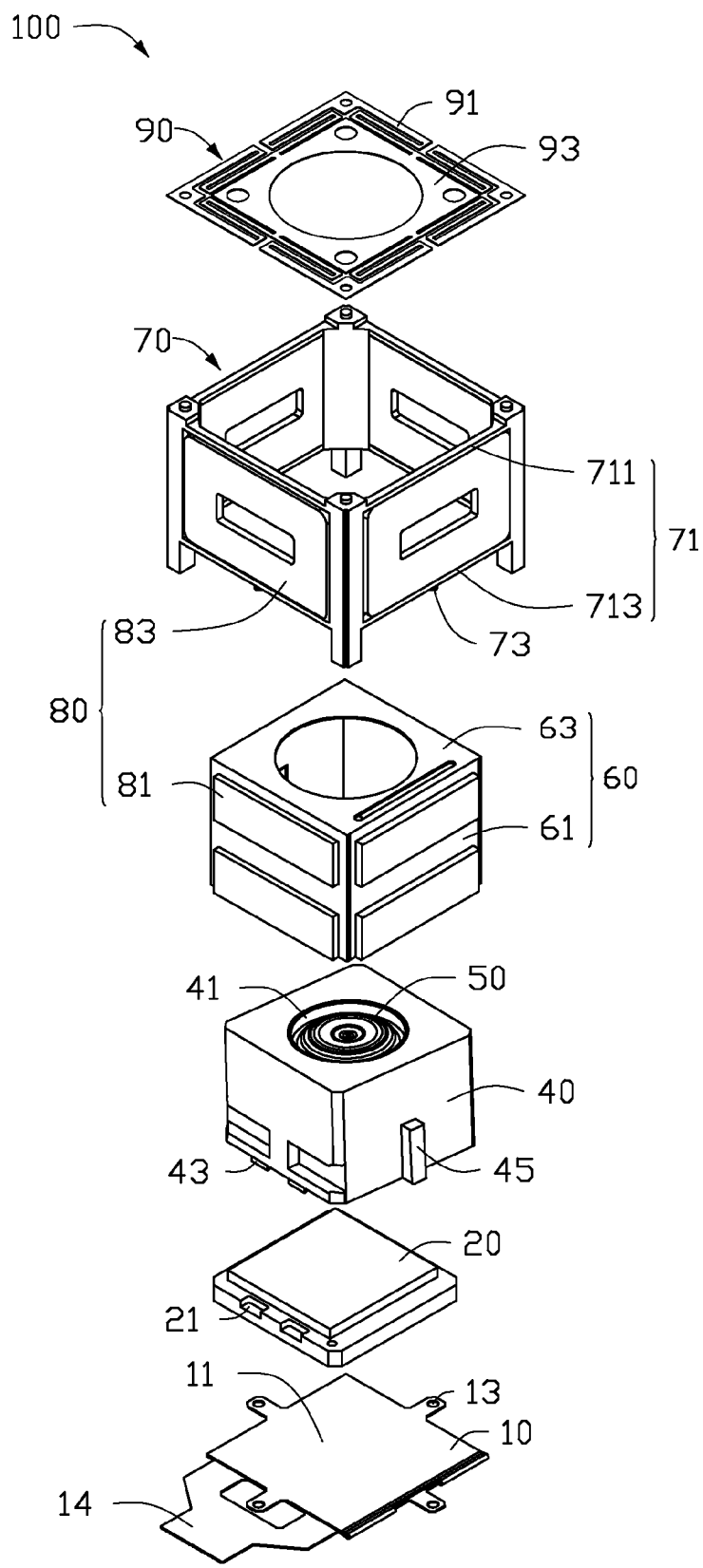
FIG. 2 is an exploded, isometric view of the lens module of FIG. 1.
Figure 3:
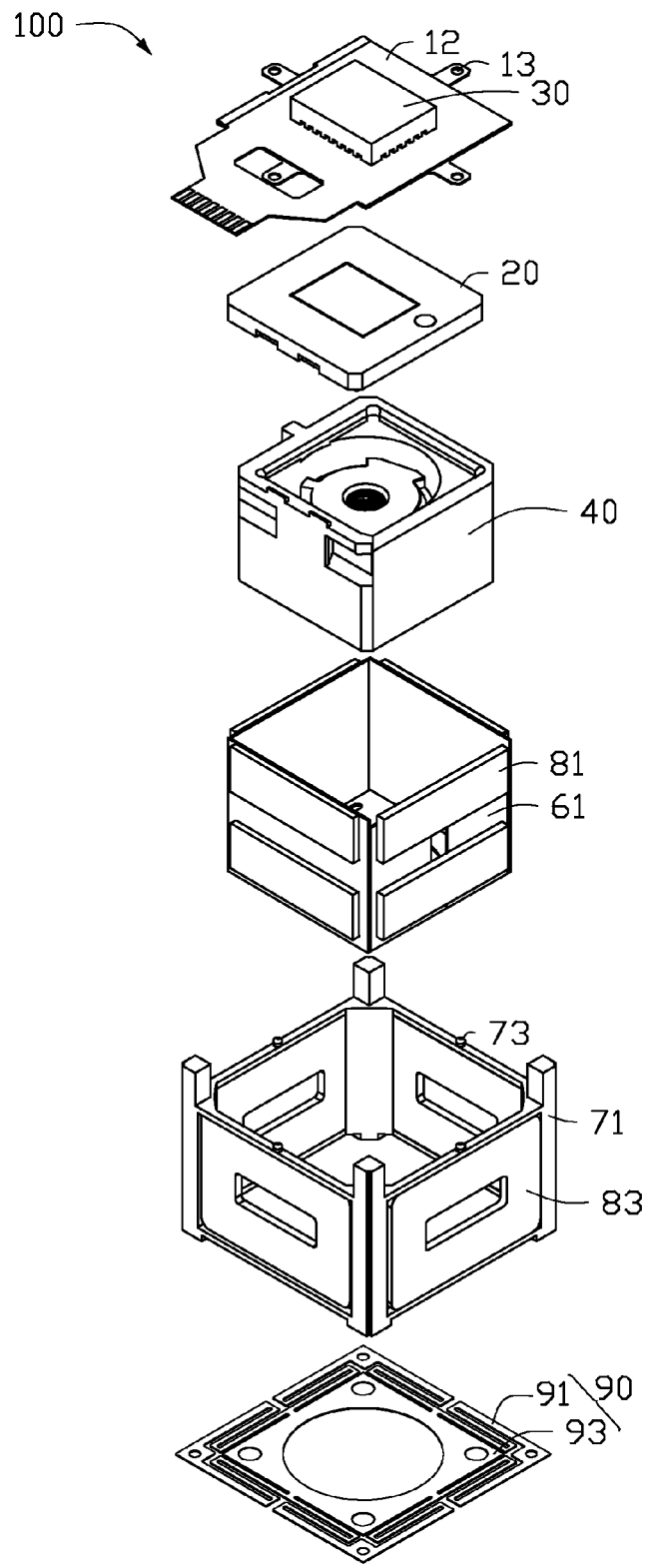
FIG. 3 is similar to the FIG. 2, but shows a view from another aspect.

Referring to FIGS. 1 through 3, a lens module 100 includes a flexible printed circuit board 10, a first sensor 20, a second sensor 30, an adjustment device 40, a lens 50, a protective frame 60, an outer housing 70, a drive mechanism 80, and a resilient member 90. The first sensor 20 and the second sensor 30 are mounted on the flexible printed circuit board 10. The outer housing 70 is connected to the flexible printed circuit board 10 and covers the adjustment device 40 and the protective frame 60. The flexible printed circuit board 10 and the resilient member 90 are arranged on opposite sides of the outer housing 70.

Figure 4:
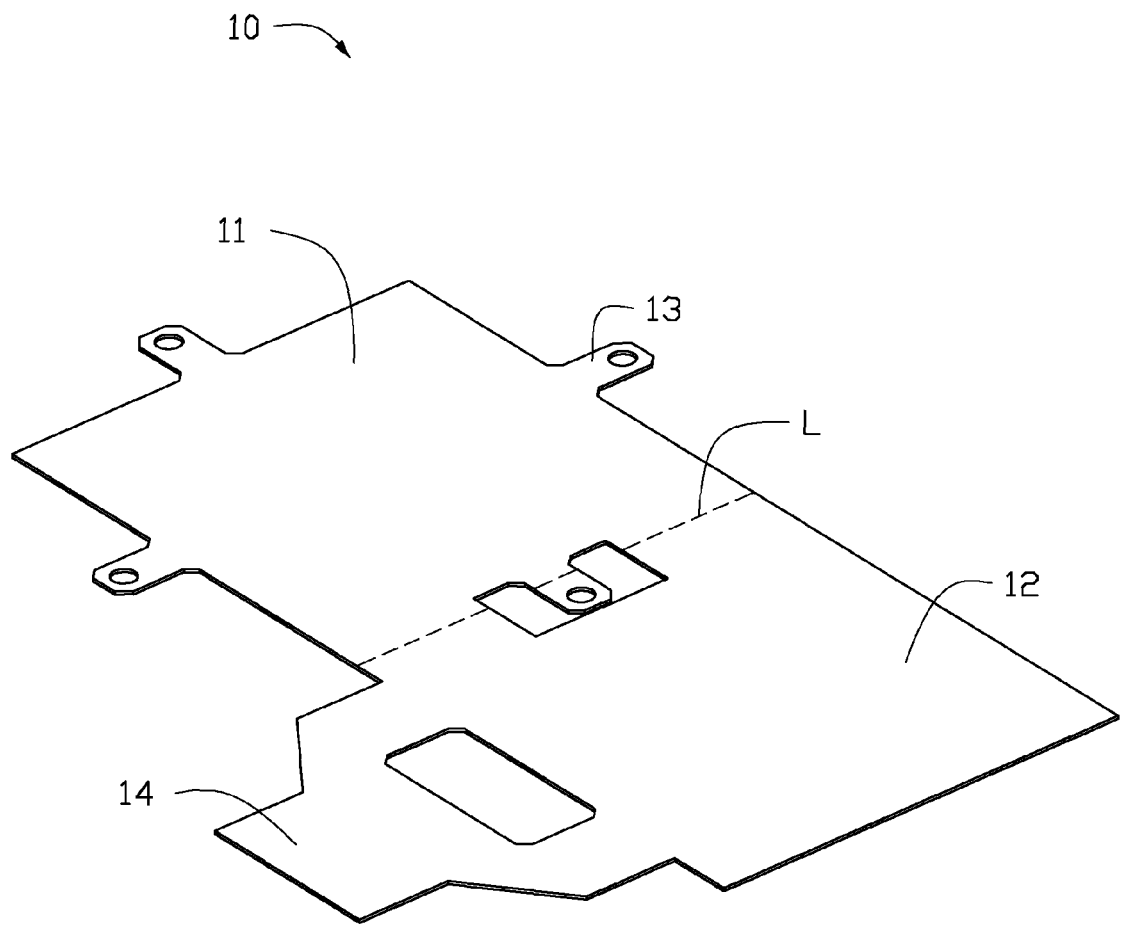
FIG. 4 is an assembled, isometric view of the flexible printed circuit board of the lens module of FIG. 1.

Referring to FIG. 4, the flexible printed circuit board 10 includes a first mounting portion 11, a second mounting portion 12, four fixing portions 13 extending from four edges of the first mounting portion 11, and a connecting portion 14 extending from one edge of the second connecting portion 12. The structure of the first mounting portion 11 is substantially the same as the second mounting portion 12, and a connecting line L is formed therebetween. The flexible printed circuit board 10 can be folded along the connecting line L. Thus, the first mounting portion 11 covers the second mounting portion 12, and the first sensor 20 and the second sensor 30 are positioned on opposite sides of the flexible printed circuit board 10. The flexible printed circuit board 10 is connected to the outer housing 70 by means of the fixing portions 13, the number of which may alternatively be one, two, or more.

Figure 5:
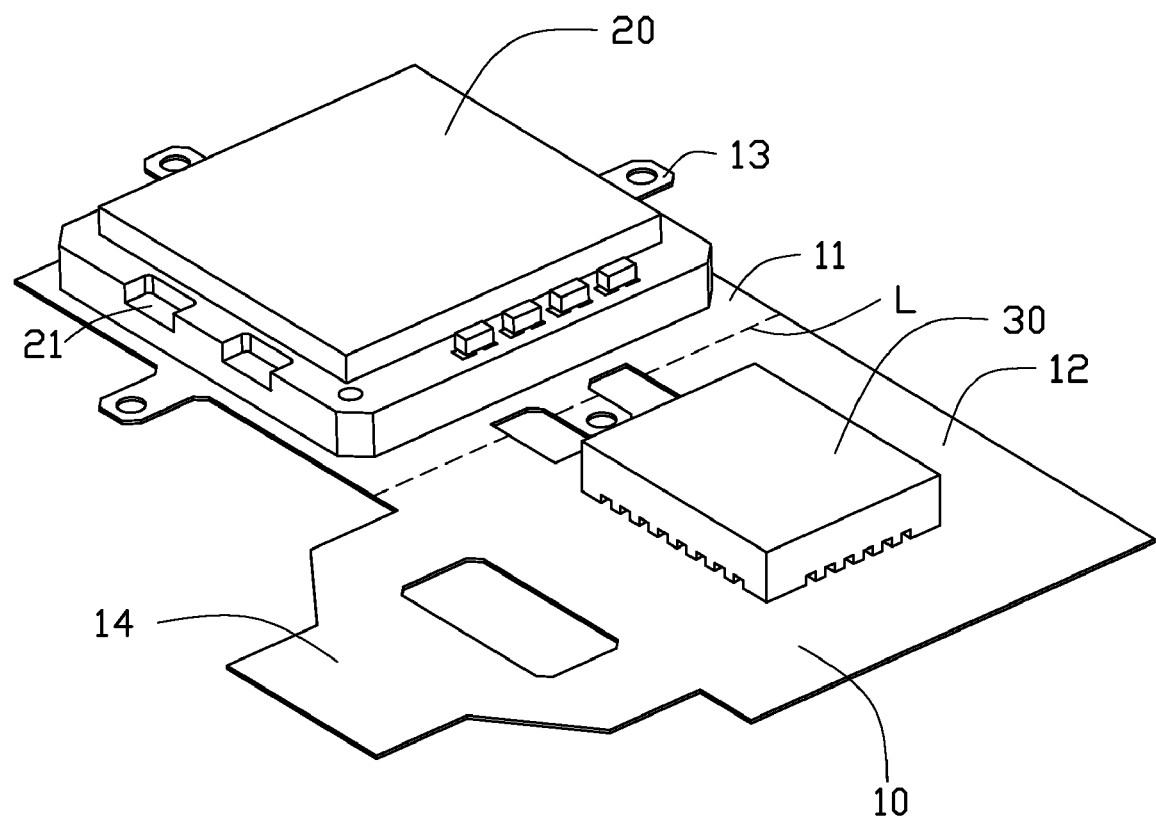
FIG. 5 is an assembled, isometric view of the first sensor and the second sensor mounted on the flexible printed circuit of the lens module of FIG. 1.
Figure 6:
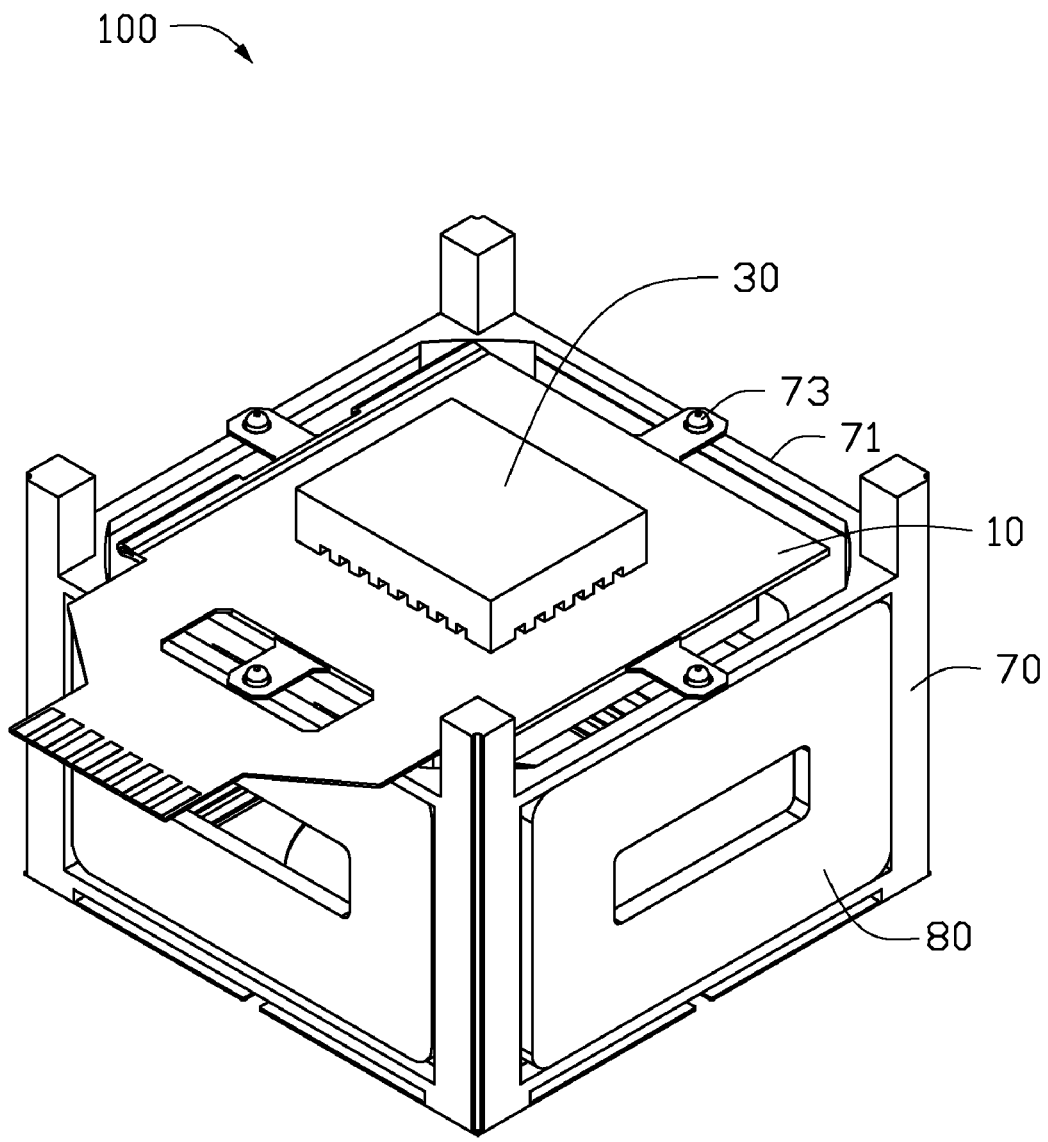
FIG. 6 is similar to the FIG. 1, but shows a view from another aspect.

Referring to FIG. 5, the first sensor 20 is adhered on the first mounting portion 11 of the flexible printed circuit board 10. The first sensor 20 includes a latching portion 21. In the illustrated embodiment, the first sensor 20 is a complementary metal oxide semiconductor sensor which receives images from the lens 50.

The second sensor 30 is adhered on the second mounting portion 12 of the flexible printed circuit board 10. In the illustrated embodiment, the second sensor 30 is a gyroscope sensor which registers linear or spiral movement of the lens 50.

Referring to FIG. 2 again, the adjustment device 40 includes a receiving portion 41, a hook 43 engaging with the latching portion 21 of the first sensor 20, and a protrusion 45 latching with the protective frame 60. The adjustment device 40 provides auto-focus function for the lens, and may be a voice coil motor actuating unit or other auto-focus device.

The lens 50 is received and fastened in the receiving portion 41 of the adjustment device 40.

The protective frame 60 includes four sidewalls 61 and a top surface 63. The four sidewalls 61 connect with each other and encircle a quadrangle (hollow rectangular block). The top surface 63 is arranged on one side of the sidewalls 61 and connected to the sidewalls 61.

The outer housing 70 includes a frame 71 and four fixing ends 73 formed on the frame 71. The frame 71 is a hollow cuboid and includes four upper edge bars 711 and four lower edge bars 713 opposite thereto. Each fixing end 73 protrudes from one lower edge bar 713.

The drive mechanism 80 includes at least one magnet 81 and a coil 83. The at least one magnet 81 is fixed on the sidewalls 61 of the protective frame 60. The coil 83 is engageably arranged between the upper edge bars 711 and the lower edge bars 713 and winds around the frame 71 of the outer housing 70. The number of the magnet 81 is decided by the amount of electrical current required. In the illustrated embodiment, the number of magnets 81 is eight, and each sidewall 61 is connected to two magnets 81.

The resilient member 90 includes a positioning portion 91 and an adjustment portion 93 elastically connected to the positioning portion 91. The positioning portion 91 is fixedly connected to the upper edge bars 711 of the outer housing 70. The adjustment portion 93 is fixedly connected to the top surface 63 of the protective frame 60. The resilient member 90 has a substantial symmetrical structure, thus, the lens 50 can be adjusted easily.

Figure 7:
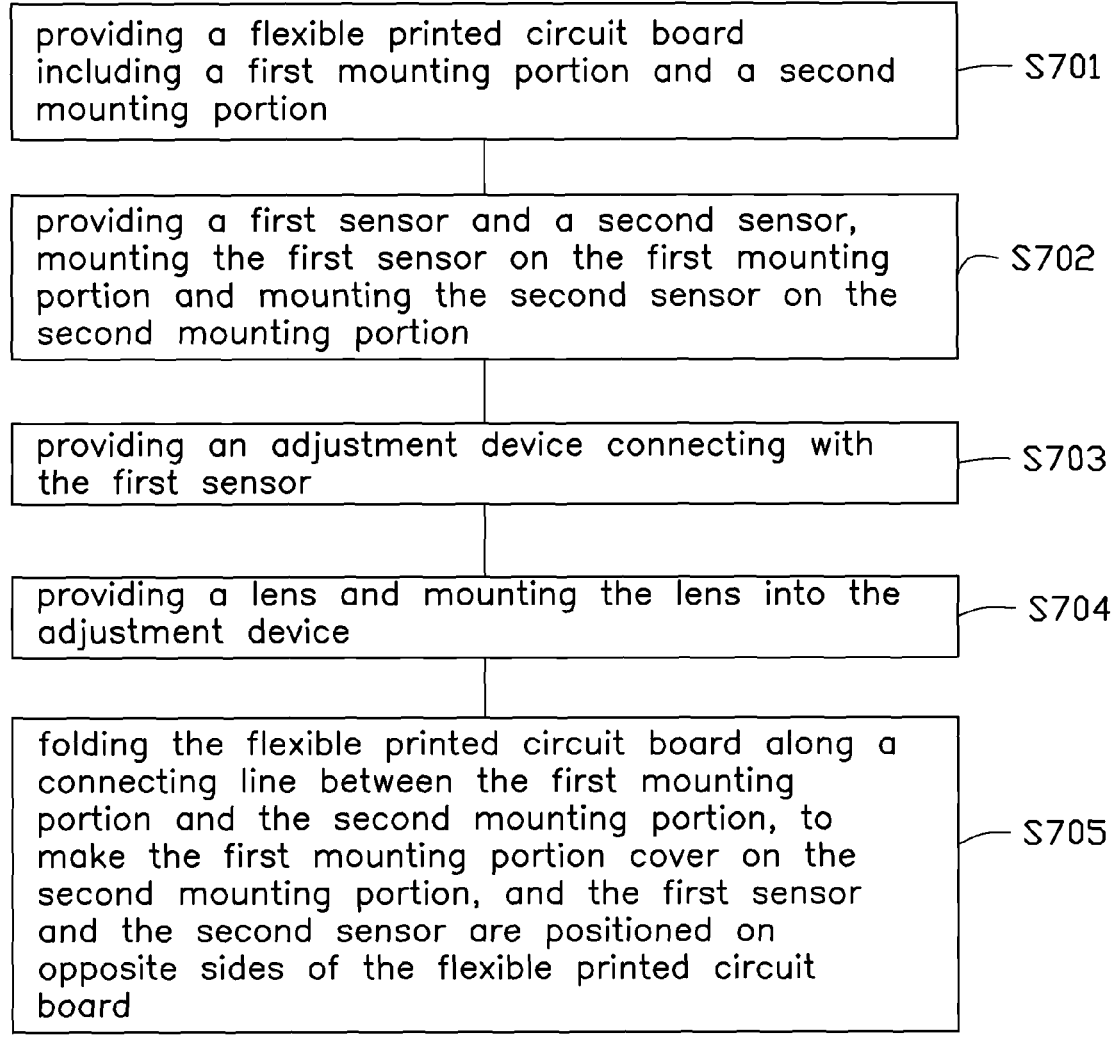
FIG. 7 is a flowchart of a method for assembling the lens module of FIG. 1.

FIG. 7 is a flowchart of a method for assembling the lens module 100 as follows. In step S701, a flexible printed circuit board 10, which includes a first mounting portion 11 and a second mounting portion 12, is provided. In step S702, a first sensor 20 is adhered on the substantially middle portion of the first mounting portion 11, and the second sensor 30 is adhered on the substantially middle portion of the second mounting portion 12. In step S703, an adjustment device 40 is connected to the first sensor 20 by latching the hook 43 with the latching portion 21 of the first sensor 20. In step S704, a lens 50 is received in the receiving portion 41 of the adjustment device 40. In step S705, the flexible printed circuit board 10 is folded along the connecting line L and the first mounting portion 11 covers the second mounting portion 12, thus, the first sensor 20 and the second sensor 30 are positioned on opposite sides of the folded flexible printed circuit board 10.

The positioning portion 91 of the resilient member 90 is fixedly connected to the upper edge bar 711 of the outer housing 70, and the adjustment portion 93 is fixedly connected with the protective frame 60. The magnets 81 are connected to the protective frame 60 and are positioned between the outer housing 70 and the protective frame 60, and the coil 83 is engageably arranged between the upper and lower edge bars 711, 713. The outer housing 70 and the protective frame 60 cover the adjustment device 40, and the protective frame 60 is arranged between the outer housing 70 and the adjustment device 40. The protective frame 60 is latched with the adjustment device 40 by means of the resistance of the protrusion 45 thereon. The outer housing 70 is connected to the flexible printed circuit board 10 by means of the engagement of the fixing end 73 and the fixing portion 13 of the flexible printed circuit board 10.

During operation of the lens module 100, the first sensor 20 receives an image from the lens 50, and the adjustment device 40 automatically adjusts the lens 50 linearly or spirally. During automatic adjustment, the protective frame 60 pulls the adjustment portion 93, and the magnets 81 of the drive mechanism 80 move correspondingly. The magnets 81 cut the coil 83 to create an electrical current, thus, the second sensor 30 can sense the position of the lens 50. The first sensor 20 and the second sensor 30 transmit the detected image and positional signals to an outer connector (not shown) connected to the connecting portion 14 of the flexible printed circuit board 10.

The foldable flexible printed circuit board 10 of the lens module 100 as disclosed can be folded after the other members are mounted, and the connecting line L between the first mounting portion 11 and the second mounting portion 12 ensure that the folding is done more precisely. Therefore, there is no need to adhere two printed circuit boards together so as to risk a positioning error. Precision is thereby increased and the manufacturing costs decreased.

Finally, while various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. A lens module, comprising:
    a lens;
    an adjustment device in which the lens is mounted, the adjustment device comprising a hook;
    a first sensor comprising a latching portion, the latching portion engaging with the hook to connect the first sensor to the adjustment device;
    a second sensor capable of detecting movement of the adjustment device; and
    a flexible printed circuit board;
    wherein the flexible printed circuit board comprises a first mounting portion and a second mounting portion, the first sensor positioned on the first mounting portion, the second sensor positioned on the second mounting portion, and the flexible printed circuit board folded along a connecting line between the first mounting portion and the second mounting portion such that the first sensor and the second sensor are positioned on opposite sides of the flexible printed circuit board.

2. The lens module of claim 1, further comprising an outer housing, the outer housing comprising a frame and at least one fixing end formed on the frame, and the flexible printed circuit board further comprising at least one fixing portion extending from an edge of the first mounting portion and connected to the at least one fixing end.

3. The lens module of claim 2, further comprising a resilient member fixedly connected to the outer housing, wherein the resilient member and the flexible printed circuit board are positioned on opposite sides of the outer housing.

4. The lens module of claim 2, further comprising a protective frame enclosing the outside of the adjustment device, the protective frame arranged between the adjustment device and the outer housing, the adjustment device further comprising a protrusion, and the protrusion latching with the protective frame to fixedly connect the adjustment portion to the protective frame.

5. The lens module of claim 4, further comprising at least one magnet, wherein the at least one magnet is fixed to the protective frame and arranged between the protective frame and the outer housing.

6. The lens module of claim 5, wherein the at least one magnet comprises eight magnets, the protective frame comprises four sidewalls, and two of the magnets are fixed on each of the sidewalls.

7. The lens module of claim 1, wherein the flexible printed circuit board further comprises a connecting portion extending from one edge of the second mounting portion.

8. The lens module of claim 1, wherein the first sensor is a complementary metal oxide semiconductor sensor, and the second sensor is a gyroscope sensor.

9. A method for assembling a lens module, comprising:
    providing a flexible printed circuit board comprising a first mounting portion and a second mounting portion;
    mounting a first sensor on the first mounting portion and mounting a second sensor on the second mounting portion, the first sensor comprising a latching portion;
    providing an adjustment device comprising a hook, and connecting the adjustment device to the first sensor by latching the hook with the latching portion;
    mounting a lens into the adjustment device; and
    folding the flexible printed circuit board along a connecting line between the first mounting portion and the second mounting portion such that the first mounting portion covers the second mounting portion, wherein the first sensor and the second sensor are positioned on opposite sides of the flexible printed circuit board.

10. The method for assembling a lens module of claim 9, further comprising covering the adjustment device with an outer housing and connecting a resilient member to the outer housing.

11. The method for assembling a lens module of claim 10, further comprising arranging a protective frame between the adjustment device and the outer housing and fixedly connecting the protective frame to the adjustment device by means of resistance of a protrusion of the adjustment device on the protective frame.

12. The method for assembling a lens module of claim 11, further comprising providing a drive mechanism comprising at least one magnet and a coil, fixing the at least one magnet to the protective frame, and fixing the coil to the outer housing.

13. A lens module, comprising:

a lens;

an adjustment device in which the lens is mounted, the adjustment device comprising a protrusion and a hook; and a protective frame enclosing the outside of the adjustment device and fixedly connected to the adjustment device by means of resistance of the protrusion on the protective frame; and a first sensor connected to the adjustment device, wherein the first sensor comprises a latching portion, and the latching portion engages with the hook to connect the first sensor to the adjustment device.

14. The lens module of claim 13, further comprising a flexible printed circuit board, the flexible printed circuit board comprising a first mounting portion, and the first sensor positioned on the first mounting portion.

15. The lens module of claim 14, further comprising an outer housing, the outer housing comprising a frame and at least one fixing end formed on the frame, and the flexible printed circuit board further comprising at least one fixing portion extending from an edge of the first mounting portion and connected to the at least one fixing end.

* * * * *